United States Patent [19]
Ryugo et al.

[11] 3,948,695
[45] Apr. 6, 1976

[54] METHOD OF DIFFUSING AN IMPURITY INTO SEMICONDUCTOR WAFERS

[75] Inventors: Noboru Ryugo; Keizo Inaniwa; Ichiro Takei, all of Takasaki, Japan

[73] Assignee: Hitachi, Ltd., Japan

[22] Filed: Feb. 7, 1974

[21] Appl. No.: 440,358

[30] Foreign Application Priority Data
Feb. 7, 1973 Japan............................... 48-14696

[52] U.S. Cl. ................. 148/189; 148/186; 148/188
[51] Int. Cl.². .......................................... H01L 7/44
[58] Field of Search ............ 148/189, 186, 187, 188

[56] References Cited
UNITED STATES PATENTS

| | | | |
|---|---|---|---|
| 2,956,913 | 10/1960 | Mack et al. | 148/189 X |
| 3,374,125 | 3/1968 | Goldsmith | 148/189 |
| 3,532,564 | 10/1970 | Gittler | 148/189 X |
| 3,755,017 | 8/1973 | Coughlin | 148/189 |

FOREIGN PATENTS OR APPLICATIONS
851,986  10/1960  United Kingdom................ 148/189

OTHER PUBLICATIONS
Benjamin, I.B.M. Technical Disclosure Bulletin, Vol. 15, No. 2, July 1972, pp. 414 and 415. 189.

*Primary Examiner*—G. Ozaki
*Attorney, Agent, or Firm*—Craig & Antonelli

[57] ABSTRACT

A method of diffusing an impurity into semiconductor wafers, wherein the semiconductor wafers and sources of the impurity are arranged in a pressure-reduced vessel or a vacuum vessel with their surfaces opposed, and the vessel is heated to deposit the impurity on the surfaces of the semiconductor wafers and to diffuse the impurity into the wafer surfaces in a separate open vessel, whereby the dispersion or variation of the surface impurity concentrations of the semiconductor wafers is lessened.

15 Claims, 2 Drawing Figures

METHOD OF DIFFUSING AN IMPURITY INTO SEMICONDUCTOR WAFERS

BACKGROUND OF THE INVENTION

1. Field of the Invention

The present invention relates to a method of diffusing an impurity into a semiconductor wafer, for example, a method of diffusing boron into silicon.

2. Description of the Prior Art

In case of diffusing boron into silicon, there is generally adopted a method in which silicon is heated in an atmosphere consisting of an inert gas such as $N_2$ containing boron therein in the form of an oxide such as $B_2O_3$, to deposit the boron on the surface portion of the semiconductor substrate, thus making a thin diffused layer of high impurity concentration in the substrate surface, and thereafter, in an atmosphere containing no impurity, the resultant substrate is heated to subject the impurity of the thinly diffused layer to a further drive-in diffusion into the semiconductor substrate. With such prior-art method, however, a dispersion, and consequently variation, arises in the quantities of the impurity deposited; in other words, the surface resistivities of the impurity-diffused substrates are non-uniform.

SUMMARY OF THE INVENTION

It is accordingly an object of the present invention to provide a method which diminishes the dispersion or variation of the quantities of the impurity to be deposited.

The inventors' research for accomplishing such object has revealed that the aforesaid dispersion is attributed to the following:

1. The temperature of the inert gas flowing into a furnace is lower than that of a uniformly-heated part or portion within the furnace, so that when the inert gas reaches the uniformly-heated part, it acts so as to drop the temperature of the silicon wafers heated at the uniformly-heated part. As a result, the temperature distribution of the silicon wafers becomes non-uniform in conformity with the flow shape of the gas therethrough.

2. The boron impurity gas of $B_2O_3$ or the like is nonuniformly diffused on account of the gas flow.

In view of these causes and in order to achieve the above object, the present invention concerns a method including the steps of arranging semiconductor wafers and impurity sources within a pressure-reduced or vacuum vessel so that they are opposite to each other, and heating the vessel to the desired diffusion temperature. Thus, the $B_2O_3$ -gas arrives uniformly at the semiconductor wafers without the influence of the flow shape due to the non-uniform flow of the $N_2$-gas as in the prior art and by utilizing the fact that the length of diffusion of the $B_2O_3$ -gas becomes large under a reduced pressure or in vacuum, i.e. the diffusion period for a given quantity of impurity is prolonged.

BRIEF DESCRIPTION OF THE DRAWINGS

In the accompanying drawing, the FIG. 1 is a sectional view showing an example of a deposition furnace which is effective for performing a preferred embodiment of the method of the present invention.

PREFERRED EMBODIMENTS OF THE INVENTION

The present invention will now be described in detail in connection with two embodiments thereof.

Figure 1:
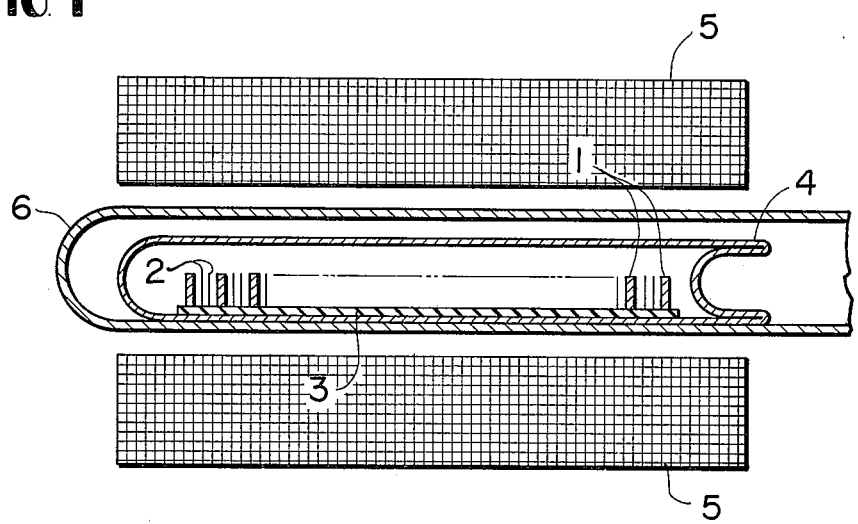

As shown in FIG. 1, tabular or plate-like impurity sources 1 containing boron oxide, for example, boron nitride ceramics of 30 to 100 mm. in diameter, the surface of which is somewhat oxidized, and silicon wafers 2 of about 30 to about 100 mm. in diameter are erected closely adjacent, e.g. about 1 to 1.5 mm., on a jig 3 with the surfaces of the impurity sources and the silicon wafers being opposed and substantially in parallel. The jig is placed into a vessel 4. The vessel has its pressure reduced (to approximately 100Torr) or is placed under a vacuum of approximately $10^{-6}$ mm.Hg and it is then hermetically sealed. The sealed vacuum vessel 4 is positioned at a uniformly-heated portion of a quartz tube 6 of a heating furnace 5 that is heated to a predetermined temperature, e.g. from 850° to 1150°C., and the vessel is heated for a predetermined period of time, e.g. 10 to 120 minutes. At this time, since the space between the wafer 2 and the impurity source 1 is under the vacuum or under the reduced pressure, the vaporizing oxide impurity is large in its length of diffusion, and hence, the oxide impurity can easily arrive at the wafer. Accordingly, even when surfaces of both the elements 1 and 2 are not in perfect opposition, no large dispersion or variation of the amount of deposited impurity arises.

More specifically, in the foregoing embodiment, the dispersion of the impurity concentrations on the surfaces of the semiconductor wafers is within ±2 percent. In contrast, in case where the deposition was carried out without employing the pressure-reduced or vacuum vessel and by causing a $N_2$-gas to flow as a carrier gas, the dispersion or variation of the impurity concentrations on the surfaces of the semiconductor wafers was ± 7 percent.

Figure 2:
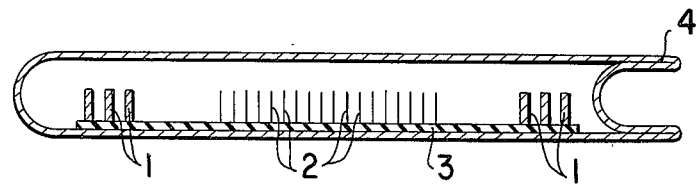
FIG. 2 shows, in a sectional view, another embodiment of the method of this invention.

Since the deposition is carried out in the pressure-reduced or vacuum vessel, wafers 2 and plate-like impurity sources 1 may be also arranged separately in the vessel 4 as shown in the embodiment illustrated in FIG. 2. The vaporized oxide impurity from sources 1 readily reaches the wafers under the low pressure of this invention. In this embodiment, the same sources and conditions are used except that the pressure is maintained at 10 Torr. or less to obtain the same results. A preferred reduced pressure range for this embodiment is from 0.1 to 1 Torr.

As apparent from the above description, the present invention heats the impurity sources and the semiconductor wafers in the state in which they are arranged in the pressure-reduced or vacuum vessel, and hence, it can also be utilized for the diffusion of any different impurity and for the deposition and diffusion to any different semiconductor. Advantageously, the pressure is reduced to not more than about 100 Torr. to obtain the desired results. The specific pressure being dependent on the arrangement of impurity sources and semiconductor wafer as well as the temperature and nature of the impurities. Furthermore, semiconductor devices of little dispersion, i.e. having little variation, in impurity concentration can be produced in such a way that the wafers subjected to the deposition as stated above are taken out of the vacuum vessel and that the thin diffused layer of impurity formed by such deposition is thereafter subjected to a subsequent drive-in diffusion by the conventional heating with an open tube.

Exemplary of the impurities which may be deposited uniformly by this method are boron, phosphorus, and antimony in which the impurity sources are plates or discs of boron nitride (BN), phosphorus nitride ($P_3N_5$) and antimony oxide ($Sb_2O_3$), respectively. In any case, the impurity source plate has its surface oxidized or has an impurity oxide surface layer.

While the novel principles of the invention have been described, it will be understood that various omissions, modifications and changes in these principles may be made by one skilled in the art without departing from the spirit and scope of the invention.

What we claim is:

1. A method of diffusing an impurity into a semiconductor wafer, comprising accommodating a semiconductor wafer and an impurity source in a pressure-reduced vessel such that the wafer and the source are arranged with their surfaces opposed, heating said pressure-reduced vessel so as to deposit the impurity on surface portions of said semiconductor wafer, removing said wafer subjected to the deposition from said vessel, and thereafter heating said wafer so as to diffuse said deposited impurity into said surface portions of said semiconductor wafer.

2. The method of claim 1, wherein said pressure-reduced vessel is hermetically sealed.

3. The method of claim 1, wherein the wafer and the impurity source are planar shaped elements and the opposing surfaces of each element are arranged substantially parallel to each other.

4. The method of claim 1, wherein the impurity source and the semiconductor wafer are arranged closely adjacent to each other.

5. The method of claim 1, wherein the pressure of the vessel is reduced to no more than about 100 Torr., and the pressure-reduced vessel is heated to 850° to 1,150°C for a period of from 10 to 120 minutes.

6. The method of claim 1, wherein the wafer is heated to diffuse said deposited impurity into said surface portions in an open tube.

7. A method of diffusing an impurity into a semiconductor wafer, comprising accommodating a semiconductor wafer and an impurity source in a pressure-reduced vessel, heating said pressure-reduced vessel so as to deposit the impurity on surface portions of said semiconductor wafer, removing said wafer subjected to the deposition from said vessel, and thereafter heating said wafer in an atmosphere containing no impurity.

8. The method of claim 7, wherein said wafer is heated in an atmosphere containing no impurity in an open tube.

9. The method of claim 8, wherein said pressurereduced vessel is hermetically sealed.

10. The method of claim 9, wherein the pressure in said pressure-reduced vessel is no more than about 100 Torr.

11. The method of claim 10, wherein said wafer and said impurity source are planar shaped elements and the opposing surfaces of each element are arranged substantially parallel to each other.

12. The method of claim 11, wherein the impurity source and the semiconductor wafer are arranged closely adjacent to each other.

13. The method of claim 9, wherein said wafer and said impurity source are planar shaped elements and the opposing surfaces of each element are arranged substantially parallel to each other.

14. The method of claim 13, wherein the impurity source and the semiconductor wafer are arranged closely adjacent to each other.

15. The method of claim 7, wherein the impurity is selected from the group consisting of boron, phosphorus and antimony.

* * * * *